United States Patent
Liu et al.

(10) Patent No.: US 11,557,479 B2
(45) Date of Patent: Jan. 17, 2023

(54) METHODS FOR EUV INVERSE PATTERNING IN PROCESSING OF MICROELECTRONIC WORKPIECES

(71) Applicant: Tokyo Electron Limited, Tokyo (JP)

(72) Inventors: Eric Chih-Fang Liu, Albany, NY (US); Akiteru Ko, Albany, NY (US); Subhadeep Kal, Albany, NY (US); Toshiharu Wada, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 231 days.

(21) Appl. No.: 16/824,346

(22) Filed: Mar. 19, 2020

(65) Prior Publication Data

US 2021/0296125 A1  Sep. 23, 2021

(51) Int. Cl.
| | |
|---|---|
| *H01L 21/033* | (2006.01) |
| *H01L 21/311* | (2006.01) |
| *H01L 21/3105* | (2006.01) |
| *H01L 21/027* | (2006.01) |

(52) U.S. Cl.
CPC ...... *H01L 21/0337* (2013.01); *H01L 21/0274* (2013.01); *H01L 21/31055* (2013.01); *H01L 21/31116* (2013.01)

(58) Field of Classification Search
None
See application file for complete search history.

(56) References Cited

U.S. PATENT DOCUMENTS

| | | | |
|---|---|---|---|
| 7,879,528 B2 | 2/2011 | Watanabe et al. | |
| 7,943,289 B2 | 5/2011 | Rangarajan et al. | |
| 9,373,552 B2 | 6/2016 | Lin et al. | |
| 2008/0261125 A1 | 10/2008 | Hishiro | |
| 2010/0203299 A1 | 8/2010 | Abdallah et al. | |
| 2011/0117749 A1 | 5/2011 | Sheu et al. | |
| 2016/0011516 A1 | 1/2016 | deVilliers | |
| 2018/0308687 A1* | 10/2018 | Smith | C23C 16/45525 |

OTHER PUBLICATIONS

International Search Report and Written Opinion issued in application No. PCT/US2020/066529 dated Apr. 26, 2021, 10 pages.

\* cited by examiner

*Primary Examiner* — Roberts P Culbert
(74) *Attorney, Agent, or Firm* — Weihrouch IP (57) ABSTRACT

Methods process microelectronic workpieces with inverse extreme ultraviolet (EUV) patterning processes. In part, the inverse patterning techniques are applied to reduce or eliminate defects experienced with conventional EUV patterning processes. The inverse patterning techniques include additional process steps as compared to the conventional EUV patterning processes, such as an overcoat process, an etch back or planarization process, and a pattern removal process. In addition, further example embodiments combine inverse patterning techniques with line smoothing treatments to reduce pattern roughness and achieve a target level of line roughness. By using this additional technique, line pattern roughness can be significantly improved in addition to reducing or eliminating microbridge and/or other defects.

19 Claims, 5 Drawing Sheets

METHODS FOR EUV INVERSE PATTERNING IN PROCESSING OF MICROELECTRONIC WORKPIECES

BACKGROUND

The present disclosure relates to methods for the manufacture of microelectronic workpieces including the formation of patterned structures on microelectronic workpieces.

Device formation within microelectronic workpieces typically involves a series of manufacturing techniques related to the formation, patterning, and removal of layers of material on a substrate. To meet the physical and electrical specifications of current and next generation semiconductor devices, process flows are being requested to reduce feature size while maintaining structure integrity for various patterning processes.

To achieve reduced feature sizes, patterning using extreme ultraviolet (EUV) lithography has been introduced in processing systems, and this EUV lithography typically uses light having a wavelength from 10 to 15 nanometers (nm) or below. For example, EUV patterning techniques have been introduced into production at sub-7 nm node advanced semiconductor device manufacturing. Although reduced feature sizes are achieved, pattern performance problems have occurred in EUV patterning. With respect to line and space patterns, for example, line roughness and pattern defects have occurred in EUV patterning. Post etch treatments after EUV patterning has provided no significant improvements to line roughness. Further, microbridge and broken line defects have been observed in resulting EUV patterns, and these types of defects are typically uncorrectable and cause fatal device failures.

Figure 1A:
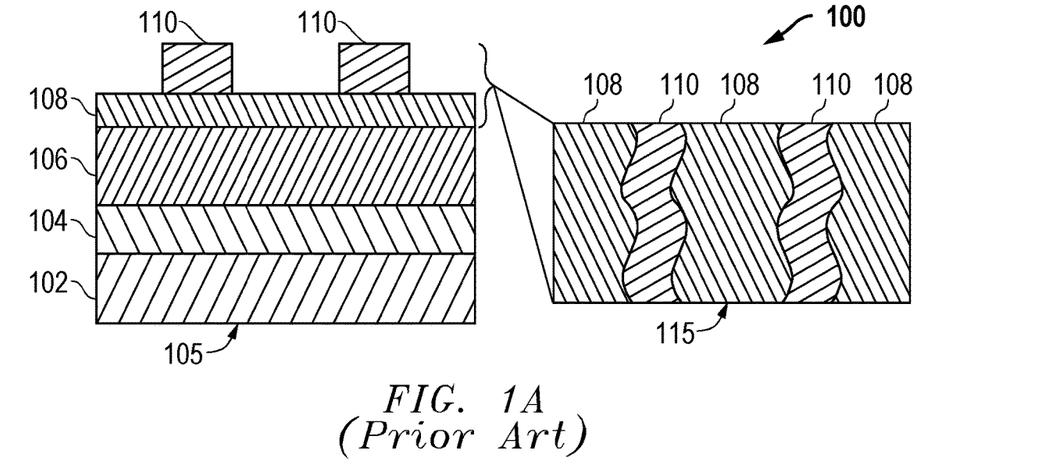
FIGS. 1A-1B (Prior Art) provide example embodiments for a conventional EUV patterning process where defects and line roughness are problems resulting from the conventional EUV patterning.

FIG. 1A (Prior Art) is an example embodiment 100 including a cross-section view 105 and a related top view 115 after forming a patterned layer 110 over a multilayer structure using an EUV patterning process. As shown in cross-section view 105, the multilayer structure includes a hardmask layer 104, a protective layer 106, and an anti-reflective coating (ARC) layer 108 formed over an underlying layer 102. The underlying layer 102 can be a substrate for a microelectronic workpiece, such as a semiconductor substrate and/or another substrate material or combination of materials. The hardmask layer 104 can be SiN and/or other hardmask materials or combination of materials. The protective layer 106 can be a spin-on-carbon (SOC) layer of amorphous carbon, a planarization layer (e.g. organic planarization layer), and/or another planarization or protective material or combination of materials. The ARC layer 108 can be a silicon-based spin-on-glass (SOG) layer and/or another ARC material or combination of materials. The patterned layer 110 can be one or more photoresist materials or combination of photoresist materials that are suitable for use in EUV lithography. As shown in the top view 115, the pattern formed by the patterned layer 110 includes lines and adjacent spaces. The underlying ARC layer 108 is seen through the spaces in the top view 115. As shown in top view 115, the edges of the lines often have a high level of roughness as a result of the EUV patterning process.

Figure 1B:
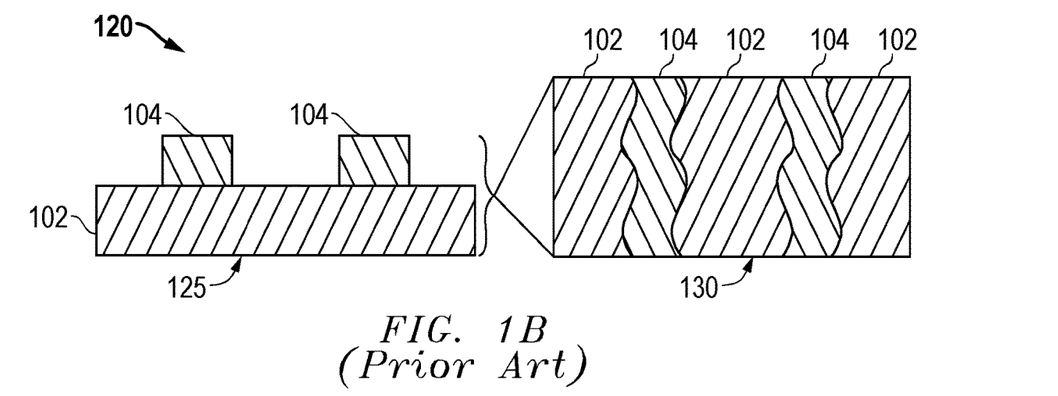

FIG. 1B (Prior Art) is an example embodiment 120 including a cross-section view 125 and a related top view 130 after the line/space pattern of the patterned layer 110 in FIG. 1A (Prior Art) has been transferred to underlying layers using one or more etch processes. The etch processes can be implemented, for example, as one or more plasma etch process steps, although other etch processes could also be used. As shown in cross-section view 125, the pattern has been transferred to the hardmask layer 104. As shown in the top view 130, the hardmask layer 104 is now patterned to match the line/space pattern formed by patterned layer 110 shown in FIG. 1A (Prior Art). The underlying layer 102 is also seen in the top view 130. As further shown in top view 130, the edges of the lines have a high level of roughness that has also been transferred. Further, this roughness is not improved significantly by post-etch treatments.

Figure 2A:
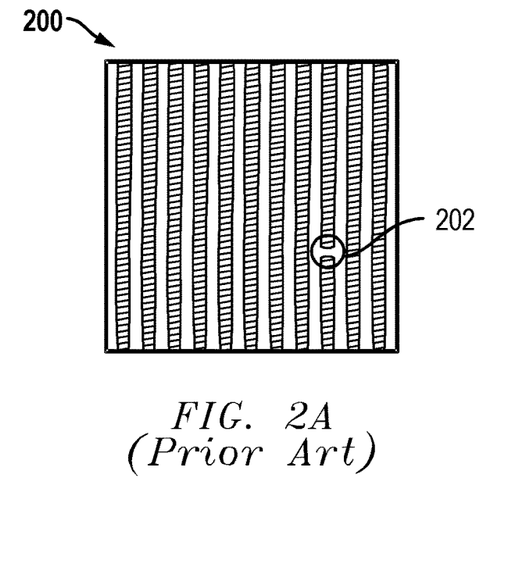
FIGS. 2A-2B (Prior Art) provide example embodiments for broken line defects and microbridge defects that often occur with respect to line/space patterns formed using the EUV patterning process of FIGS. 1A-1B (Prior Art).
Figure 2B:
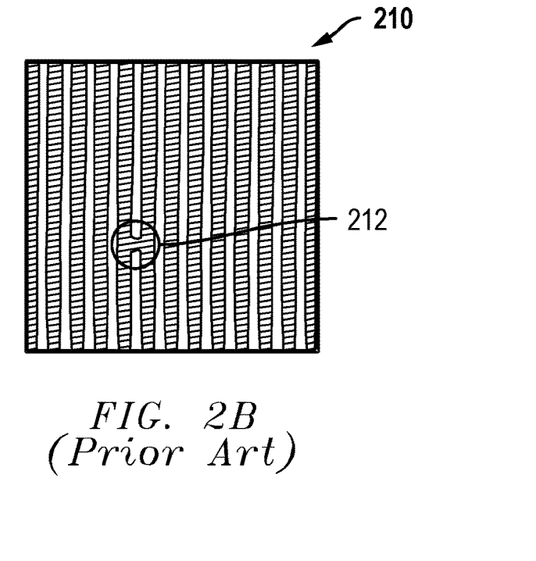

FIGS. 2A-2B (Prior Art) provide example embodiments for broken line defects and microbridge defects that often occur with respect to line/space patterns formed using EUV patterning processes. FIG. 2A (Prior Art) provides an example embodiment 200 for a top view of a line/space pattern where a gap 202 within one line causes a broken line defect. FIG. 2B (Prior Art) provides an example embodiment 210 for a top view of a line/space pattern where material bridge 212 formed between two adjacent lines causes a microbridge defect. As indicated above, these broken line defects and microbridge defects are typically uncorrectable and cause fatal device failures in resulting devices formed in the microelectronic workpieces being processed.

SUMMARY

Embodiments are described herein that apply inverse EUV patterning in the processing of microelectronic workpieces. In part, the inverse patterning techniques are applied to reduce or eliminate defects experienced with conventional EUV patterning processes, such as microbridge defects. The inverse patterning techniques include additional process steps as compared to the conventional EUV patterning processes, such as an overcoat process, an etch back or planarization process, and a pattern removal process. In addition, further example embodiments combine inverse patterning techniques with line smoothing treatments to reduce pattern roughness and achieve a target level of line roughness. By using this additional technique, line pattern roughness can be significantly improved in addition to reducing or eliminating microbridge defects. Different or additional features, variations, and embodiments can also be implemented, and related systems and methods can be utilized as well.

For one embodiment, a method for extreme ultraviolet processing of a microelectronic workpiece is disclosed including forming a patterned layer over a multilayer structure using an EUV patterning process, forming a coating layer over the patterned layer where the coating layer is a different material from the patterned layer, removing a portion of the coating layer to expose the patterned layer where a remaining portion of the coating layer has an inverse pattern with respect to a pattern for the patterned layer, performing one or more etch processes to remove the patterned layer and to leave the coating layer in the inverse pattern, and transferring the inverse pattern to at least one underlying layer within the multilayer structure.

In additional embodiments, the EUV patterning process includes forming an EUV photoresist layer and exposing the photoresist layer with a pattern using EUV light. In further embodiments, the EUV photoresist layer includes a chemically amplified resist (CAR) material or a non-CAR material. In further embodiments, the EUV light has a wavelength from 10 to 15 nanometers. In further additional embodiments, the coating layer includes at least one of SiOx, SiN, SiC, amorphous silicon, metal oxide, or metal nitride.

In additional embodiments, the coating layer includes a same material as a top layer of the multilayer structure. In further embodiments, the coating layer and the top layer include an anti-reflective coating (ARC) material.

In additional embodiments, the removing includes performing at least one of an etch back process or a planarization process. In further additional embodiments, the removing leaves the remaining portion of the coating layer at a height equivalent to or below a height for the patterned layer.

In additional embodiments, the pattern and the inverse pattern include lines and spaces. In further embodiments, the coating layer covers one or more bridges formed between adjacent lines in the pattern of the patterned layer. In still further embodiments, the bridges remain covered by the coating layer after the patterned layer is removed.

In additional embodiments, the method includes performing one or more line smoothing treatments after the patterned layer is removed. In further embodiments, a target level of line roughness is achieved using the one or more line smoothing treatments. In further embodiments, the one or more line smoothing treatments include one or more plasma etch processes, wet etch processes, deposition processes, or combination of such processes.

In additional embodiments, the one or more etch processes to remove the patterned layer include one or more plasma etch processes. In further additional embodiments, the forming of the coating layer includes one or more spin-on coating processes, chemical vapor deposition (CVD) processes, plasma deposition processes, or other deposition processes.

In additional embodiments, the multilayer structure includes a hardmask layer formed over a substrate for the microelectronic workpiece. In further embodiments, the inverse pattern is transferred to the hardmask layer.

In additional embodiments, the multilayer structure includes an anti-reflective coating (ARC) layer, a protective layer, and a hardmask layer formed over a substrate for the microelectronic workpiece.

Different or additional features, variations, and embodiments can also be implemented, and related systems and methods can be utilized as well.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Methods are disclosed to process microelectronic workpieces with inverse EUV patterning processes. Embodiments described herein apply inverse patterning techniques to reduce or eliminate defects experienced with conventional EUV patterning processes. As described in more detail below, the inverse patterning techniques of the disclosed embodiments include additional process steps as compared to the conventional EUV patterning processes. For example, additional process steps can include an overcoat process, an etch back or planarization process, and a pattern removal process. In addition, further example embodiments combine inverse patterning techniques with line smoothing treatments to reduce pattern roughness and achieve a target level of line roughness. These further embodiments apply an additional pattern smoothing treatment before pattern transfer to underlying layers. By using this additional technique, line pattern roughness can be significantly improved in addition to reducing or eliminating microbridge defects and/or other defects. For example, material bridges left between pattern lines after EUV patterning are covered and effectively removed by the inverse patterning thereby leading to lower defect counts. Other advantages and implementations can also be achieved while still taking advantage of the process techniques described herein.

Figure 3A:
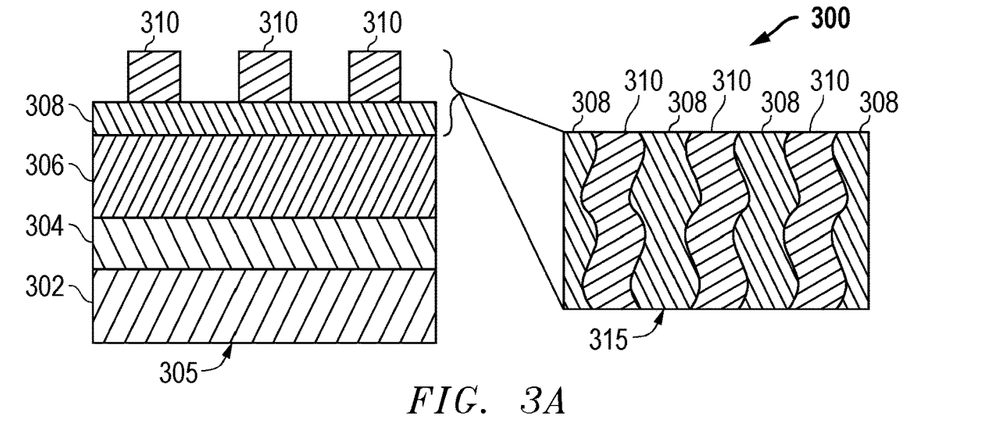
FIGS. 3A-3F provide example embodiments for an inverse EUV patterning process that reduces or eliminates defects, such as microbridge defects that occur in conventional EUV patterning processes, and that further allows improved line smoothing treatments to be applied.

FIG. 3A is similar to FIG. 1A (Prior Art) and is an example embodiment 100 including a cross-section view 305 and a related top view 315 after forming a patterned layer 310 over a multilayer structure using an EUV patterning process. EUV lithography can be used to form the patterned layer 310. For example, an EUV photoresist layer can be formed and then exposed to a pattern using EUV light. Unexposed portions of the EUV photoresist layer can then be removed to form the patterned layer 310, for example, using one or more photoresist etch processes. As shown in cross-section view 305, the multilayer structure includes a hardmask layer 304, a protective layer 306, and an anti-reflective coating (ARC) layer 308 formed over an underlying layer 302. It is noted that additional and/or different layers could also be used. The underlying layer 302 can be a substrate for a microelectronic workpiece, such as a semiconductor substrate and/or another substrate material or combination of materials. The hardmask layer 304 can be SiN and/or another hardmask material or combination of materials. The protective layer 306 can be a spin-on-carbon (SOC) layer of amorphous carbon, a planarization layer (e.g. organic planarization layer), and/or another planarization or protective material or combination of materials. The ARC layer 308 can be silicon-based spin-on-glass (SOG) layer and/or another ARC material or combination of materials. The patterned layer 310 can be one or more photoresist materials or combination of photoresist materials that are suitable for use in EUV lithography. For example, the EUV photoresist material for the patterned layer 310 can be a chemically amplified resist (CAR) material or a non-CAR material including but not limited to SiOx, SiN, SiC, amorphous silicon (a-Si), metal oxide, metal nitride, and/or other suitable materials. As shown in the top view 315, the pattern formed by the patterned layer 310 includes lines and adjacent spaces. The underlying ARC layer 308 is seen through the spaces in the top view 315. As also shown in top view 315, the edges of the lines have a high level of roughness as a result of the EUV patterning process.

Figure 3B:
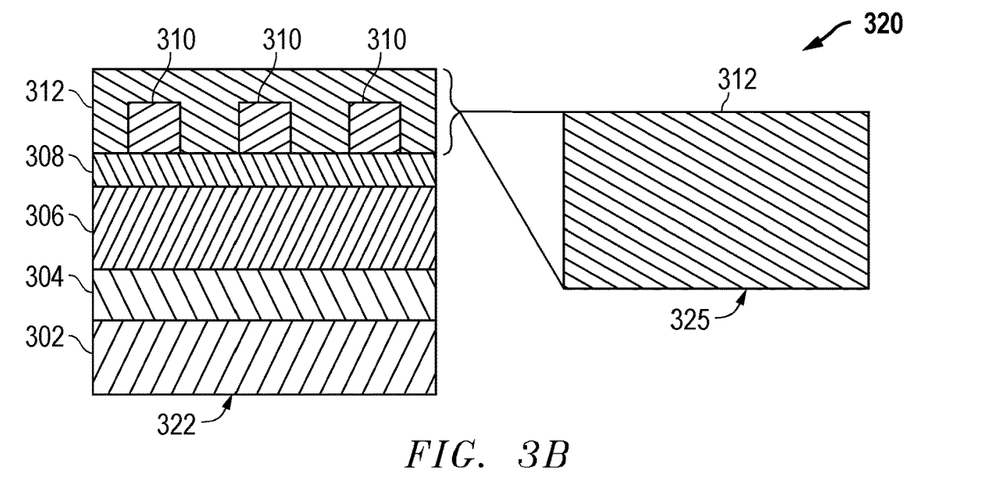

FIG. 3B is an example embodiment 320 including a cross-section view 322 and a related top view 325 after an overcoat process has been performed to form a coating layer 312. As shown in top view 325, the coating layer 312 covers the patterns formed by the patterned layer 310. The material used for this coating layer 312 is a different material from the material used for the patterned layer 310. However, the material for the coating layer 312 can be the same or different material from the material used for the ARC layer 308, which is the top layer in the multilayer structure. The coating layer 312 can be, for example, SiOx, SiN, SiC, amorphous silicon (a-Si), metal oxide, metal nitride, and/or other suitable materials. As noted above, the coating layer 312 is a different material from patterned layer 310. Further, it is noted that the coating layer 312 can be formed, for example, using one or more layer formation processes including a spin-on coating process, a chemical vapor deposition (CVD) process, a plasma deposition process, and/or other deposition processes or combination of processes.

Figure 3C:
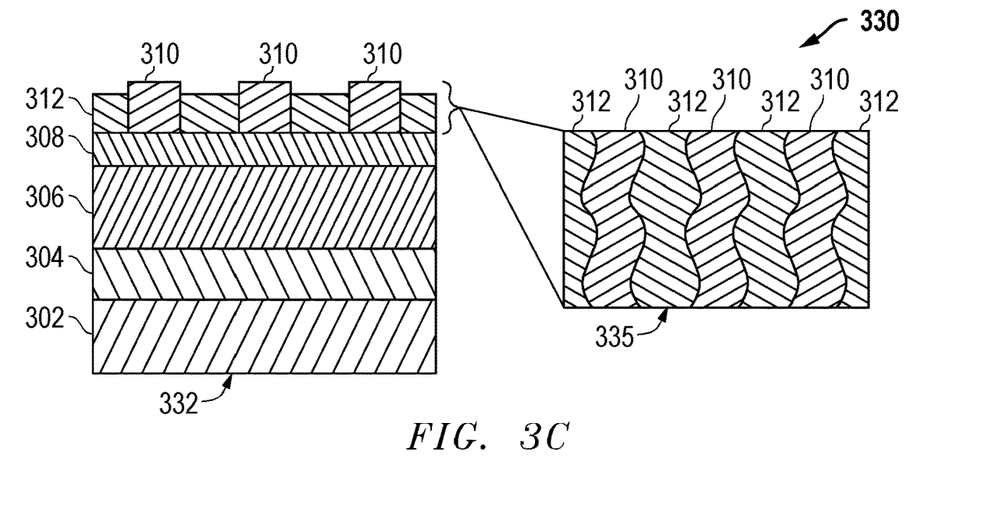

FIG. 3C is an example embodiment 330 including a cross-section view 332 and a related top view 335 after a layer removal process has been performed to expose the patterned layer 310. For example, the layer removal process leaves the coating layer 312 at a height equivalent to or below a height for the patterned layer 310. As shown in top view 335, the pattern formed by the patterned layer 310 based upon the EUV patterning process is exposed by the layer removal process. The layer removal process can be, for example, one or more etch processes (e.g., plasma etch processes) that etch back the coating layer 312, one or more planarization processes that planarize the coating layer 312 along with the patterned layer 310, and/or one or more other processes or combination of processes.

Figure 3D:
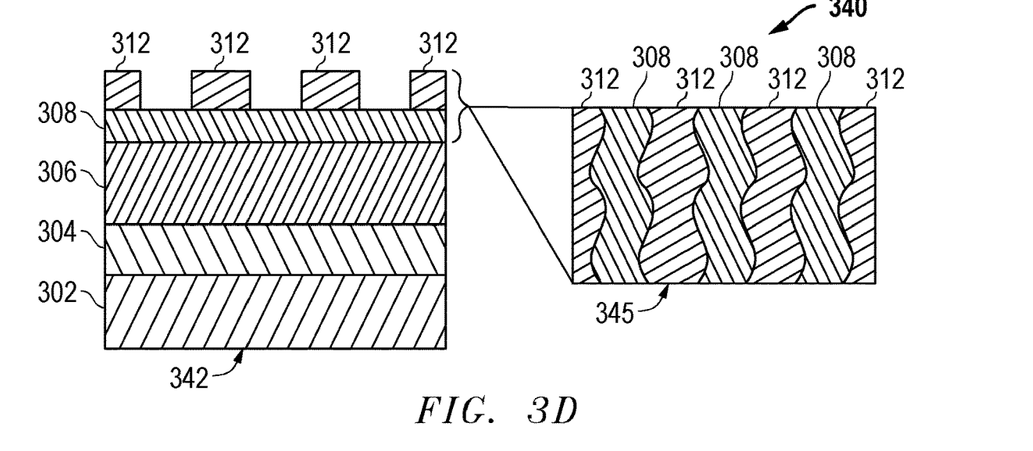

FIG. 3D is an example embodiment 340 including a cross-section view 342 and a related top view 345 after one or more etch processes has been performed to remove the patterned layer 310 and to leave the coating layer 312 in the original space locations between the patterned layer 310. As such, the remaining portions of the coating layer 312 form an inverse pattern with respect to the pattern formed by the patterned layer 310. The etch processes can be implemented, for example, as one or more plasma etch process steps, although other etch processes or combinations of etch processes could also be used. As shown in top view 345, the remaining portions of the coating layer 312 form lines in the original space locations within the patterned layer 310, and the original lines formed by the patterned layer 110 are now spaces adjacent the lines formed by the coating layer 312. As such, an inverse pattern with respect to the original pattern is formed by the remaining portion of the coating layer 312. In part, this inverse patterning reduces or eliminates microbridge defects as described in more detail with respect to FIGS. 4A-4B below. As shown in top view 415, however, the edges of the lines can still have a high level of roughness. It is also noted that the underlying ARC layer 108 is seen through the spaces in the inverse pattern.

Figure 3E:
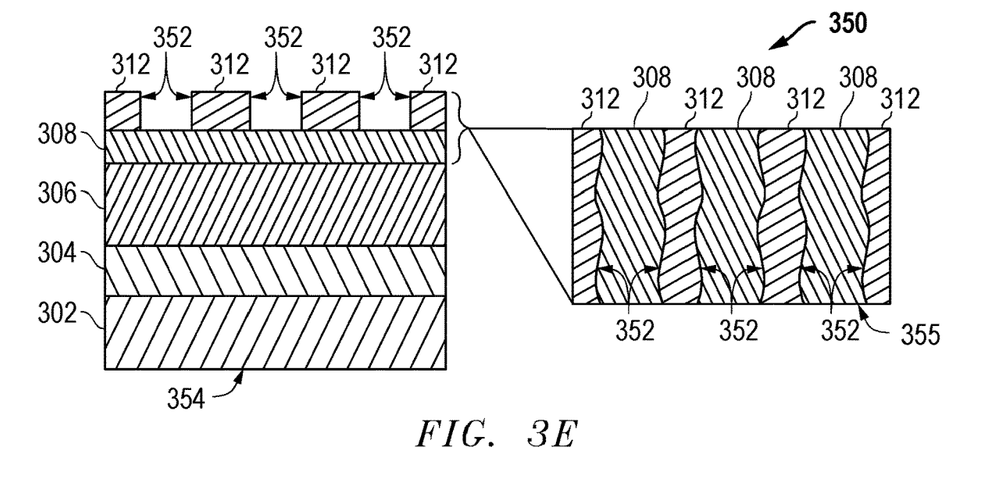

FIG. 3E is an example embodiment 350 including a cross-section view 354 and a related top view 355 after one or more line smoothing treatments have been performed to reduce line roughness and/or to achieve a target level of line roughness for sidewalls 352 of lines formed by the patterned coating layer 312. As shown in the top view 355, the sidewalls 352 of the lines formed by the inverse pattern of the coating layer 312 are significantly smoother as compared to the lines shown in the top view 345 in FIG. 3D. It is noted that the material used for the coating layer 312 can be selected to allow for improved line smoothing treatments to be applied as compared to available techniques for the original patterned layer 310. For example, a selective etch or treatment can be applied to coating layer 312 to reduce roughness of the patterned lines. The line smoothing treatments can be, for example, one or more plasma etch processes, wet etch processes, deposition processes, and/or other processes or combination of processes. As a further example, a material with a higher etch resistance can be used for the coating layer 312 as compared to the material for the original patterned layer 310. The higher etch resistance allows use of improved line smoothing treatments. Other variations can also be implemented.

Figure 3F:
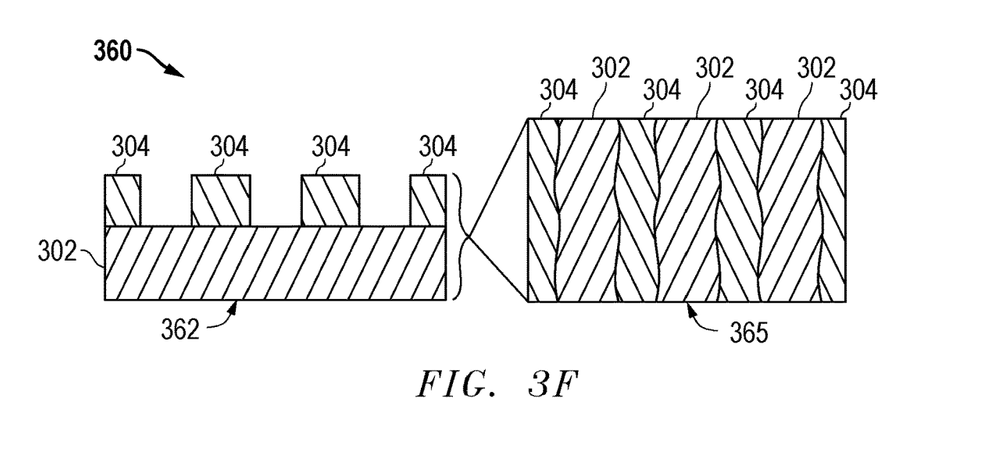

FIG. 3F is an example embodiment 360 including a cross-section view 362 and a related top view 365 after the inverse pattern of the coating layer 312 in FIG. 3E has been transferred to underlying layers using one or more etch processes. The etch processes can be implemented, for example, as one or more plasma etch process steps, although other etch processes or combination of processes could also be used. As shown in cross-section view 362, the inverse pattern has been transferred to the hardmask layer 304. As shown in the top view 365, the hardmask layer 304 is now patterned to match the line/space pattern formed by the inverse patterning shown in FIG. 3D. The underlying layer 302 is also seen in top view 365. Further, the improved line roughness achieved in FIG. 3E has followed with the pattern transfer in FIG. 3F.

Figure 4A:
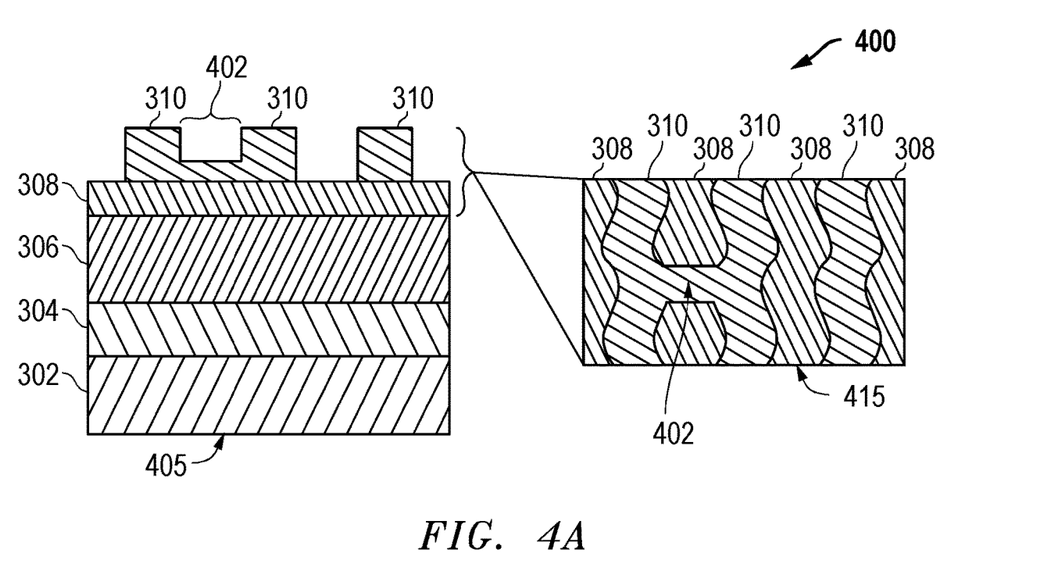
FIGS. 4A-4B provide example embodiments where it is shown that microbridge defects that would arise from conventional EUV patterning are reduced or eliminated by the inverse EUV patterning of the disclosed embodiments.
Figure 4B:
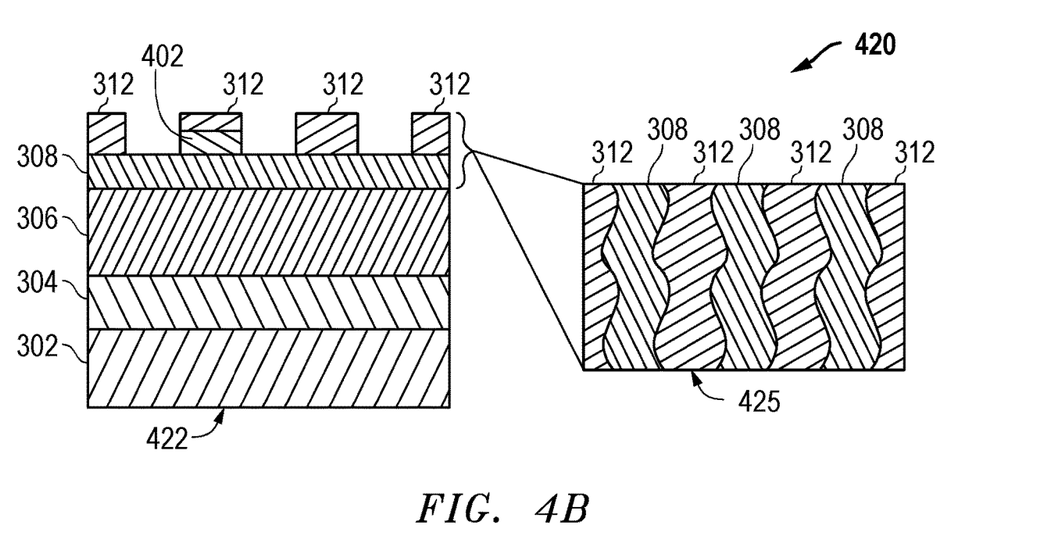

FIGS. 4A-4B provide example embodiments where it is shown that microbridge defects that would arise from conventional EUV patterning are reduced or eliminated by the inverse EUV patterning of the disclosed embodiments.

FIG. 4A is an example embodiment 400 including a cross-section view 405 and a related top view 415 where material bridge 402 represents a EUV patterning defect. As shown in cross-section view 405, the material bridge 402 has a lower height than the adjacent lines formed by the patterned layer 310. As shown in top view 415, this material bridge 402 extends between two adjacent lines within the patterned layer 310. In prior solutions, this bridging defect would be transferred to underlying layers during pattern transfer and cause a microbridge defect. With the inverse patterning of the disclosed embodiments, however, this microbridge defect is removed. For example, assuming the material bridge 402 has a lower height than adjacent lines in the EUV patterned layer 310, the material bridge 402 will be covered after formation of the coating layer 312 in FIG. 3B.

FIG. 4B is an example embodiment 420 including a cross-section view 422 and a related top view 425 after inverse patterning has removed the original patterned layer 310 and left the inverse pattern in coating layer 312. As shown in cross-section view 422, the material bridge 402 is still covered by the patterned coating layer 312. As shown in top view 425, the material bridge 402 is not visible and has been effectively removed by the patterned coating layer 312. When the inverse pattern is subsequently transferred into underlying layers as shown in FIG. 3F, the material bridge 402 has already been effectively removed and does not cause the microbridge defect that would have been caused in prior solutions using conventional EUV patterning.

Figure 5:
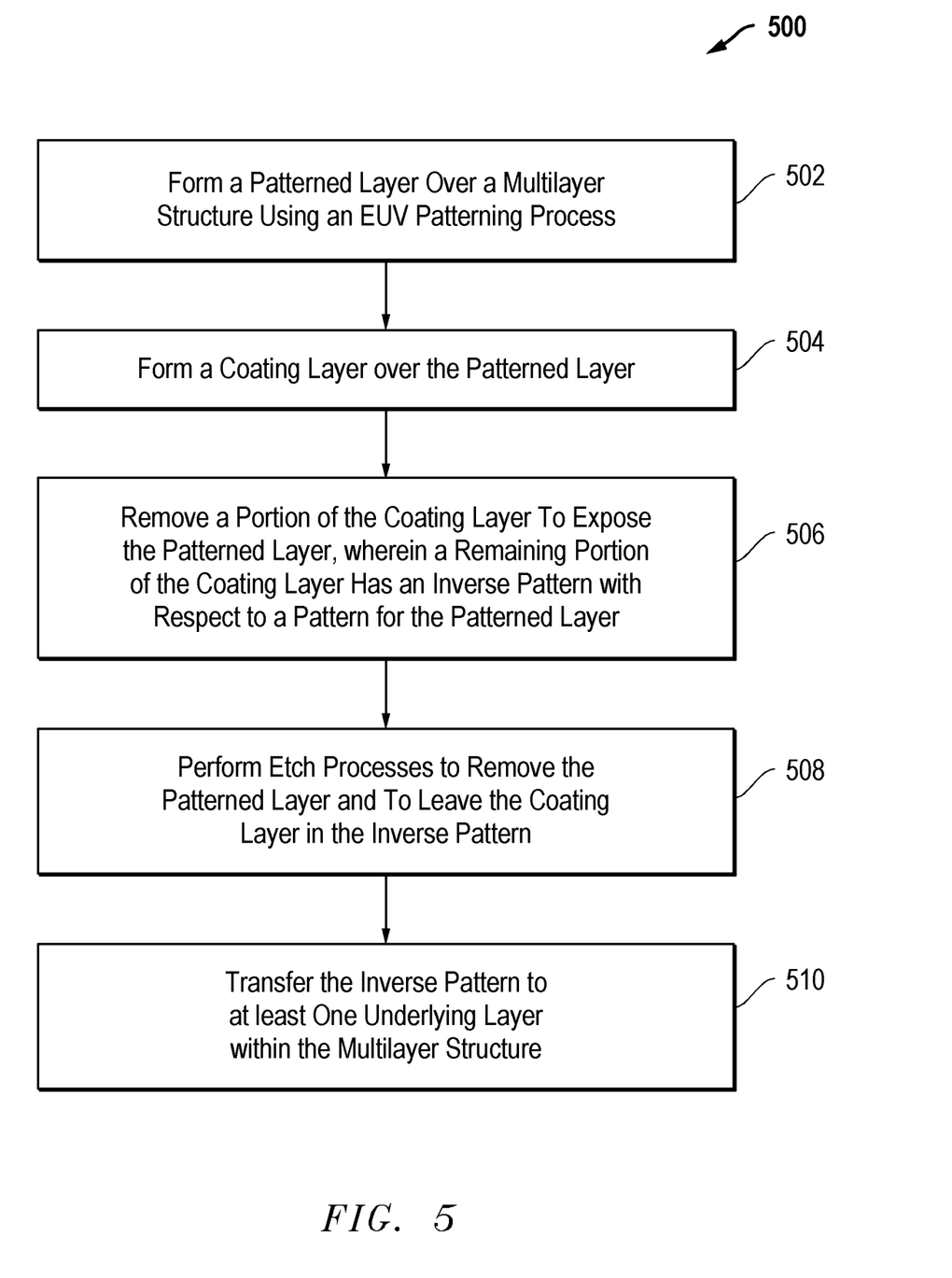
FIG. 5 is a process flow diagram of an example embodiment to apply inverse EUV patterning processes to microelectronic workpieces as described herein.

FIG. 5 is a process flow diagram 500 of an example embodiment to apply inverse EUV patterning to process microelectronic workpieces. In block 502, a patterned layer is formed over a multilayer structure using an extreme ultraviolet (EUV) patterning process. In block 504, a coating layer is formed over the patterned layer. In block 506, a portion of the coating layer is removed to expose the patterned layer, and the remaining portion of the coating layer has an inverse pattern with respect to a pattern for the patterned layer. In block 508, one or more etch processes are performed to remove the patterned layer and to leave the coating layer in the inverse pattern. In block 510, the inverse pattern is transferred to at least one underlying layer within the multilayer structure. It is noted that additional or different process steps can also be used while still taking advantage of the techniques described herein.

It is noted that one or more deposition processes can be used to form the material layers described herein. For example, one or more depositions can be implemented using chemical vapor deposition (CVD), plasma enhanced CVD (PECVD), physical vapor deposition (PVD), atomic layer deposition (ALD), and/or other deposition processes. For a plasma deposition process, a precursor gas mixture can be used including but not limited to hydrocarbons, fluorocarbons, or nitrogen containing hydrocarbons in combination with one or more dilution gases (e.g., argon, nitrogen, etc.) at a variety of pressure, power, flow and temperature conditions. Lithography processes with respect to PR layers can be implemented using optical lithography, extreme ultraviolet (EUV) lithography, and/or other lithography processes. The etch processes can be implemented using plasma etch processes, discharge etch processes, and/or other desired etch processes. For example, plasma etch processes can be implemented using plasma containing fluorocarbons, oxygen, nitrogen, hydrogen, argon, and/or other gases. In addition, operating variables for process steps can be controlled to ensure that critical dimension (CD) target parameters for vias are achieved during via formation. The operating variables may include, for example, the chamber temperature, chamber pressure, flowrates of gases, frequency and/or power applied to electrode assembly in the generation of plasma, and/or other operating variables for the processing steps. Variations can also be implemented while still taking advantage of the techniques described herein.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them; etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate including a layer of semiconductive material. As used herein, the term "bulk substrate" means and includes not only silicon wafers, but also silicon-on-insulator ("SOI") substrates, such as silicon-on-sapphire ("SOS") substrates and silicon-on-gloss ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method for extreme ultraviolet processing of a microelectronic workpiece, comprising:

forming a patterned layer over a multilayer structure using an extreme ultraviolet (EUV) patterning process, the multilayer structure including a top under layer directly under the patterned layer;

forming a coating layer over the patterned layer, the coating layer being a different material from the patterned layer, and wherein a first part of the coating layer is on and in contact with the patterned layer and a second part of the coating layer is on and in contact with the top under layer;

removing a portion of the coating layer to expose the patterned layer, wherein a remaining portion of the coating layer has an inverse pattern with respect to a pattern for the patterned layer;

performing one or more etch processes to remove the patterned layer and to leave the coating layer in the inverse pattern, the removing of the patterned layer forming a plurality of features, such that the top under layer is exposed through spaces between the plurality of features, the plurality of features including:

(a) a first feature having the coating layer directly on top of the under layer; and (b) a second feature which is formed by both the patterned layer and the coating layer with a coating layer part of the second feature on top of the second feature, and a patterned layer part of the second feature between the top under layer and the coating layer part of the second feature; and transferring the inverse pattern to the multilayer structure.

2. The method of claim 1, wherein the EUV patterning process comprises forming an EUV photoresist layer and exposing the photoresist layer with a pattern using EUV light.

3. The method of claim 2, wherein the EUV photoresist layer comprises a chemically amplified resist (CAR) material or a non-CAR material.

4. The method of claim 2, wherein the EUV light has a wavelength from 10 to 15 nanometers.

5. The method of claim 1, wherein the coating layer comprises at least one of SiOx, SiN, SiC, amorphous silicon, metal oxide, or metal nitride.

6. The method of claim 1, wherein the coating layer comprises a same material as the top under layer of the multilayer structure.

7. The method of claim 6, wherein the coating layer and the top under layer comprise a silicon based anti-reflective coating (ARC) material.

8. The method of claim 1, wherein the removing of the coating layer comprises performing at least one of an etch back process or a planarization process.

9. The method of claim 1, wherein the removing of the coating layer leaves the remaining portion of the coating layer at a height equivalent to or below a height for the patterned layer.

10. The method of claim 1, further comprising performing one or more line smoothing treatments after the patterned layer is removed.

11. The method of claim 10, wherein a target level of line roughness is achieved using the one or more line smoothing treatments.

12. The method of claim 10, wherein the one or more line smoothing treatments comprise one or more plasma etch processes, wet etch processes, deposition processes, or combination of such processes.

13. The method of claim 1, wherein the one or more etch processes to remove the patterned layer comprises one or more plasma etch processes.

14. The method of claim 1, wherein the forming of the coating layer comprises one or more spin-on coating processes, chemical vapor deposition (CVD) processes, plasma deposition processes, or other deposition processes.

15. The method of claim 1, wherein the multilayer structure comprises a hardmask layer formed over a substrate for the microelectronic workpiece, and the hardmask layer is below the top under layer.

16. The method of claim 15, wherein the inverse pattern is transferred to the hardmask layer.

17. The method of claim 1, wherein the multilayer structure comprises an anti-reflective coating (ARC) layer, a protective layer, and a hardmask layer formed over a substrate for the microelectronic workpiece, the hardmask layer being below the ARC layer.

18. The method of claim 1, wherein the top under layer is a silicon based anti-reflective coating.

19. The method of claim 1, wherein the multilayer structure comprises a hardmask below the silicon based anti-reflection coating.

* * * * *